US006444411B1

(12) United States Patent
Law et al.

(10) Patent No.: US 6,444,411 B1
(45) Date of Patent: Sep. 3, 2002

(54) NON-LIQUID ALCOHOL SUBSTITUTE COMPOSITION FOR LITHOGRAPHIC FOUNTAIN SOLUTIONS

(76) Inventors: Trevor Law, 2211 N. 38th Ave., Hollywood, FL (US) 33081; Telluckram Maharaj, 3451 NW. 35 Ct., Lauderdale Lakes, FL (US) 33309

( * ) Notice: Subject to any disclaimer, the term of this patent is extended or adjusted under 35 U.S.C. 154(b) by 0 days.

(21) Appl. No.: 09/668,958

(22) Filed: Sep. 25, 2000

(51) Int. Cl.7 .................................................. G03F 7/32

(52) U.S. Cl. ...................................................... 430/331

(58) Field of Search .......................................... 430/331

(56) References Cited

U.S. PATENT DOCUMENTS

| | | | | | |
|---|---|---|---|---|---|
| 4,374,036 | A | * | 2/1983 | Canale et al. | |
| 5,061,607 | A | * | 10/1991 | Walls | 430/309 |
| 5,637,444 | A | * | 6/1997 | Matsumoto | 430/331 |
| 5,897,693 | A | * | 4/1999 | Whitehead | 106/2 |
| 6,187,081 | B1 | * | 2/2001 | Sures et al. | 106/2 |

* cited by examiner

*Primary Examiner*—Hoa Van Le
(74) *Attorney, Agent, or Firm*—Scott L. Lampert

(57) ABSTRACT

A non-liquid composition suitable as an alcohol replacement in fountain solutions prepared by dry blending 10–50% by weight of a film forming/humectant agent, 10–50% by weight of a plasticizer/hygroscopic agent, 0–5% by weight of an acetylinic surfactant, 0–10% by weight of an ethoxylated surfactant system, 0–1% by weight of a silicone glycol and 0–1% by weight of an anti-foaming agent.

4 Claims, No Drawings

NON-LIQUID ALCOHOL SUBSTITUTE COMPOSITION FOR LITHOGRAPHIC FOUNTAIN SOLUTIONS

BACKGROUND OF THE INVENTION

1 Field of the Invention

The present invention relates to fountain solutions for use in lithographic printing operations and, more particularly, to a non-liquid composition suitable for use as an alcohol substitute in fountain solutions.

2 Description of the Related Art

Offset printing, or lithography, is a printing technique in which the image to be printed is fixed on a generally flat plate. The lithographic process is based on the principle that oil and water do not mix. Using this principle, the offset printing plate is constructed so that the image areas are ink receptive and lipophilic or water repellant and the non-image areas are hydrophilic or water receptive and ink repellant. Fountain solutions, also referred to as dampening solutions, are the agents used in lithography to wet the non-image area of the plate and repel the ink from such non-image areas. A key ingredient in the correct functioning of fountain solutions for many years was alcohol, normally isopropanol, although other alcohols were used in some cases.

Alcohol reduces the surface tension of the liquid fountain solution and acts as a wetting agent, viscosity modifier, emulsification aid and anti-foam agent. This enables the fountain solution to rapidly wet the hydrophilic areas of the printing plate. However, because of its volatile organic compound (VOC) characteristic, and resultant health and environmental effects, the use of alcohol is undesirable. Moreover, alcohol is an added cost and tends to reduce the quality of the printed material.

Several products exist in the industry in liquid forms that are used routinely to reduce, or replace alcohol. These products generally require a separate fountain solution to provide pH control, desensitization and corrosion inhibition. Such products are all supplied in liquid form and are principally based on glycols and glycol ethers.

The liquid nature of these solutions causes the containers holding such solutions to be heavy and cumbersome, resulting in significant storage, handling and freight costs. Moreover, the liquid nature of these solutions increases the potential of environmental contamination following spillages and exposure to potentially harmful vapors from VOCs during manufacture and use of the solutions. Also, even after the solution has been consumed, disposal of the empty containers may pose environmental and health hazards.

In view of such health, financial and environmental hazards, more recent liquid fountain solutions have been developed for use without alcohol. However, many of these non-alcohol, liquid fountain solutions employ other VOCs or chemicals considered to be harmful, such as ethylene glycol monobutyl ether, some of which are now regulated or prohibited by federal or state laws due to their inherent environmental and health hazards. Furthermore, the use of the alternative surface-active agents often results in further undesirable properties, such as foaming and ink over-emulsification.

Accordingly, there is still a need in the art for a non-liquid alcohol substitute for fountain solutions. The present invention is particularly suited to overcome those problems which remain in the art in a manner not previously known.

SUMMARY OF THE INVENTION

The present invention is directed towards a novel, non-liquid alcohol substitute composition for use in the elimination of alcohol from offset printing systems prepared by dry blending 10–50% by weight of a film forming/humectant agent, 10–50% by weight of a plasticizer/hygrosopic agent, 0–5% by weight of an acetylinic surfactant, 0–10% by weight of an ethoxylated surfactant system comprising a blend of 0–100% by weight of an octyl phenol ethoxylate, 0–100% by weight of an alcohol ethoxylate and 0–100% by weight of a nonyl ethoxylate, 0–1% by weight of a silicone glycol and 0–1% by weight of an anti-foaming agent.

It is an object of the present invention to provide an alcohol substitute for fountain solutions that has all the advantages of the prior art devices and none of the disadvantages.

It is another object of the present invention to provide a non-liquid alcohol substitute composition for fountain solutions.

It is still a further object of the present invention to provide such a composition that may be conveniently packaged, shipped and stored in an efficient, economical and environmentally safe manner.

It is also an object of the present invention to provide such a composition that is compatible with commercially available fountain solutions.

It is yet another object of the present invention to provide such a composition that substantially reduces or eliminates the quantity of alcohol required for optimum performance.

It is a further object of the present invention to provide such a composition that minimizes VOC emissions and the corresponding potential health and environmental hazards.

It is yet a further object of the present invention to provide such a composition that includes a surfactant system capable of attaining dynamic surface tension measurements similar to those generated by liquid solutions having isopropyl alcohol.

These and other objects and advantages of the present invention will become more readily apparent in the description that follows.

DETAILED DESCRIPTION OF THE PREFERRED EMBODIMENT

Before explaining the disclosed embodiment of the present invention in detail, it is to be understood that the invention is not limited in its application to the details of the particular arrangement shown since the invention is capable of other embodiments. Also, the terminology used herein is for the purpose of description and not of limitation.

The present invention is directed towards a new and improved non-liquid alcohol substitute composition for use with offset printing fountain solutions. The composition is prepared by dry blending 10–50% by weight of a film forming/humectant agent, 10–50% by weight of a plasticizer/hygroscopic agent, 0–5% by weight. of an acetylinic surfactant, 0–10% by weight of an ethoxylated surfactant system, 0–1% by weight of a silicone glycol and 0–1% by weight of an anti-foaming agent.

The film forming/humectant agent is preferably a polyhydric alcohol, such as Sorbitol. However, other suitable film forming/humectant agents may, alternatively, be employed.

The plasticizing/hygroscopic agent is structured to create a hydrophilic film over the non-image areas of the printing plate and prevent premature drying. In the preferred embodiment, the plasticizing/hygroscopic agent is a high molecular weight polyglycol, such as polyethyelne glycol 3350.

The acetylinic surfactant is a low foaming wetting agent, which lowers the dynamic surface tension of the resultant liquid fountain solution so that it is suitable for use with printing presses. In the preferred embodiment, the acetylinic surfactant is of the type manufactured by Air Products and Chemicals, Inc. under the brand name Surfynol®.

The ethoxylated surfactant system is designed to replicate the emulsifying, detergency, low foaming and wetting characteristics of the isopropanol found in conventional fountain solutions. In the preferred embodiment, the ethoxylated surfactant system comprises a blend of 0–100% by weight of an octyl phenol ethoxylate, 0–100% by weight of a nonyl phenol ethoxylate and 0–100% by weight of an alcohol ethoxylate. It should be appreciated that the blend can comprise different combinations of these elements or, alternatively, can include various other elements, which, in combination, will provide similar emulsifying, detergency, low foaming and wetting characteristics.

The silicone glycol reduces the surface tension and provides a high level of detergency. It also reduces the quantity. of acetylinic surfactant required to achieve the necessary dynamic surface tension reduction.

The anti-foaming agent prevents the formation of foam after the composition is mixed with water. In the preferred embodiment, the anti-foaming agent is of a silicone type commonly found in liquid surfactant systems, such as that manufactured by Dow Chemical Company under the name Y-30.

It should be appreciated that the composition of the present invention may be embodied in a wide range of operable formulations as illustrated by the examples below. The composition may be provided in solid or powder form and is structured to be dissolved in water prior to being added to the fountain solution. Although pre-dissolving the powder or solid in water attains a greater degree of accuracy when dosing into the fountain solution, the powder could, alternatively, be added directly to the pre-mixed fountain solution. Each of the compositions disclosed in the following examples were formulated in a free-flowing powder form.

EXAMPLE 1

| Ingredient | Percent By Weight |
|---|---|
| Sorbitol Crystal Granular | 49.00 |
| PEG 3350 | 49.00 |
| Surfynol 465 | 1.12 |
| Tergitol Min Foam 1-X | 0.12 |
| Merpol LFH | 0.40 |
| Dow 190 | 0.12 |
| DOW Y-30 | 0.24 |

The composition of Example 1 was mixed at a ratio of 1 pound of powder per gallon of water. This mixture was agitated until the powder was fully dissolved. The resulting blend was added to a premixed, liquid fountain solution at a ratio of 4 fluid ounces per gallon of fountain solution.

The resulting fountain solution was applied to an offset printing press fitted with an alcohol dampening system. In such a system, the dampening solution is required to rapidly wet the surfaces of the metallic rollers and printing plates and polymeric rollers. Prior to the addition of the alcohol substitute containing fountain solution, this machine was operated with a conventional liquid alcohol substitute. Using the alcohol substitute containing fountain solution, waste levels were found to be at or below standard levels and the resultant print quality was equal to or higher than that normally obtained from this machine using conventional liquid alcohol substitutes.

EXAMPLE 2

| Ingredient | Percent By Weight |
|---|---|
| Sorbitol | 49.00 |
| Peg 3350 | 49.00 |
| Surfynol 465 | 2.00 |

EXAMPLE 3

| Ingredient | Percent By Weight |
|---|---|
| Sorbitol | 62.50 |
| PEG 3350 | 32.50 |
| Tergitol Min Foam 1X | 1.25 |
| Merpol LFH | 1.25 |
| DOW DC 190 | 2.00 |
| Dow Y-30 | 0.50 |

The compositions of Examples 2 and 3 were mixed at ratios varying between 1.5 pounds and 3 pounds of powder per 55 gallons of pre-mixed, liquid fountain solution. The resulting solutions were used with an AB Dick 360 printing press equipped with a so-called alcohol dampening system. This system previously operated using a fountain solution having 10% isopropyl alcohol. No alcohol was used in the fountain solutions of Examples 2 and 3. Using the composition of Example 2, acceptable printing was observed with a minimum of changes to mechanical settings being required. Results using the Composition of Example 3 were very similar. The amount of fountain solution required at start up was slightly higher than normal, but ink emulsification was lower, resulting in a more defined, higher quality sheet being printed.

The foregoing examples illustrate that the non-liquid fountain solution composition of the present invention may be embodied in a wide range of operable formulations and is suitable for use in all aspects of offset lithographic printing, from small single color presses to large format web offset presses. Moreover, it is capable of use with commercially available fountain solution concentrates to reduce VOC emissions and their attendant environmental and health hazards.

While the invention has been described, disclosed, illustrated and shown in various terms of certain embodiments or modifications, which it has presumed in practice, the scope of the invention is not intended to be, nor should it be deemed to be, limited thereby and such other modifications or embodiments as may be suggested by the teachings herein are particularly reserved, especially as they fall within the breadth and scope of the claims here appended.

What is claimed is:

1. A non-liquid composition suitable as an alcohol substitute in fountain solutions comprising quantities of 10–50% by weight of sorbitol in combination with 10–50% by weight of polyethylene glycol, 0–10% by weight of a ethoxylated surfactant system, 0–1% by weight of a silicon glycol, 0–5% by weight of an acetylinic compound and 0–1% by weight of an anti-foaming agent.

2. A non-liquid composition suitable as an alcohol substitute in fountain solutions as recited in claim 1 wherein said ethoxylated surfactant system comprises 0–100% by weight of octyl phenol ethoxylate, 0–100% by weight of alcohol ethoxylate and 0–100% by weight of nonyl ethoxylate.

3. A non-liquid composition suitable as an alcohol substitute in fountain solutions as recited in claim 1 wherein said anti-foaming agent is silicon emulsion.

4. A non-liquid composition suitable as an alcohol substitute in fountain solutions as recited in claim 1 wherein said acetylinic compound is a surfactant structured for dynamic surface tension reduction.

* * * * *